US008518757B2

(12) United States Patent
Anderson et al.

(10) Patent No.: US 8,518,757 B2
(45) Date of Patent: Aug. 27, 2013

(54) METHOD OF FABRICATING STRAINED SEMICONDUCTOR STRUCTURES FROM SILICON-ON-INSULATOR (SOI)

(75) Inventors: Brent Alan Anderson, Jericho, VT (US); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 684 days.

(21) Appl. No.: 12/707,975

(22) Filed: Feb. 18, 2010

(65) Prior Publication Data

US 2011/0198695 A1 Aug. 18, 2011

(51) Int. Cl.
| | |
|---|---|
| *H01L 21/00* | (2006.01) |
| *H01L 21/84* | (2006.01) |
| *H01L 21/338* | (2006.01) |
| *H01L 21/336* | (2006.01) |
| *H01L 21/36* | (2006.01) |
| *H01L 21/3205* | (2006.01) |
| *H01L 21/4763* | (2006.01) |

(52) U.S. Cl.
USPC ........... 438/151; 438/149; 438/157; 438/176; 438/197; 438/279; 438/283; 438/296; 438/479; 438/585; 438/587

(58) Field of Classification Search
None
See application file for complete search history.

(56) References Cited

U.S. PATENT DOCUMENTS

| | | | |
|---|---|---|---|
| 3,514,845 A | 6/1970 | Legat et al. | |
| 3,600,651 A | 8/1971 | Duncan | |
| 4,508,579 A | 4/1985 | Goth et al. | |
| 4,688,073 A | 8/1987 | Goth et al. | |
| 4,743,565 A | 5/1988 | Goth et al. | |
| 5,031,007 A | 7/1991 | Chaffin et al. | |
| 5,270,265 A | 12/1993 | Hemmenway et al. | |
| 6,258,679 B1 * | 7/2001 | Burns et al. | 438/303 |
| 6,274,907 B1 | 8/2001 | Nakagawa | |
| 6,624,478 B2 | 9/2003 | Anderson et al. | |
| 6,962,838 B2 | 11/2005 | Anderson et al. | |
| 6,982,460 B1 * | 1/2006 | Cohen et al. | 257/331 |
| 7,115,525 B2 * | 10/2006 | Abatchev et al. | |
| 7,439,542 B2 * | 10/2008 | Yang | 257/64 |
| 2003/0077882 A1 | 4/2003 | Shih et al. | |
| 2008/0090360 A1 * | 4/2008 | Krivokapic | 438/283 |

* cited by examiner

*Primary Examiner* — Michael Jung
(74) *Attorney, Agent, or Firm* — Schmeiser, Olsen & Watts; Anthony Canale

(57) ABSTRACT

A strained semiconductor structure and method of making the structure. The method includes: forming a pad layer on a top surface of a silicon layer of a substrate, the substrate comprising the silicon layer separated from a supporting substrate by a buried oxide layer; forming openings in the pad layer and etching trenches through the silicon layer to the buried oxide layer in the openings to form silicon regions from the silicon layer; forming spacers on the entirety of sidewalls of the silicon regions exposed in the trenches; forming oxide regions in corners of the silicon regions proximate to both the sidewalls and the buried oxide layer to form strained silicon regions, the oxide regions not extending to the pad layer; and removing at least a portion of the spacers and filling remaining spaces in the trenches with silicon to form filled regions abutting the strained silicon region.

10 Claims, 9 Drawing Sheets

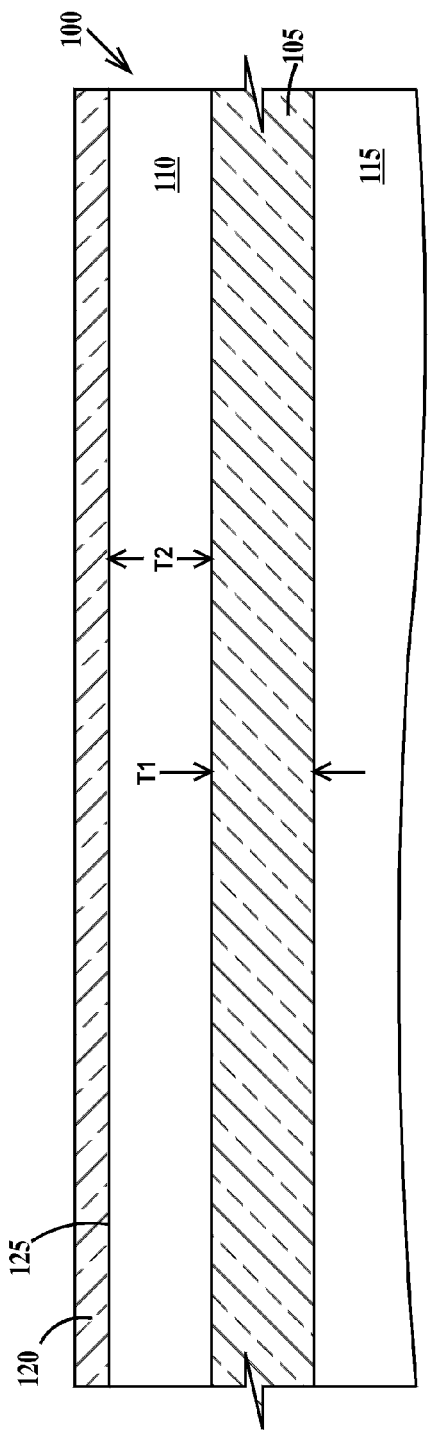
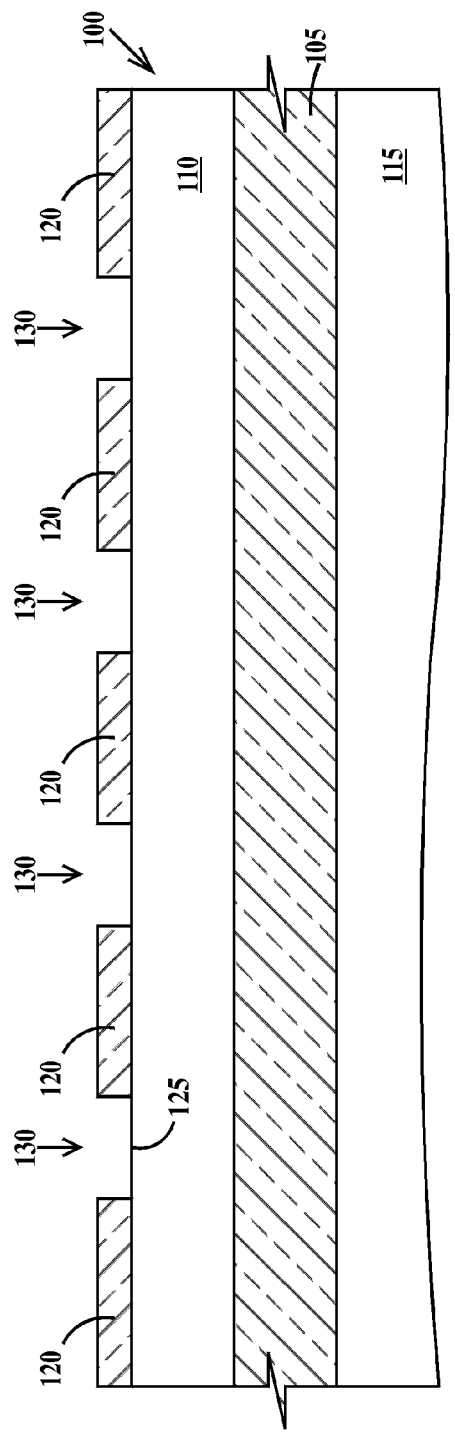
FIG. 1
FIG. 2

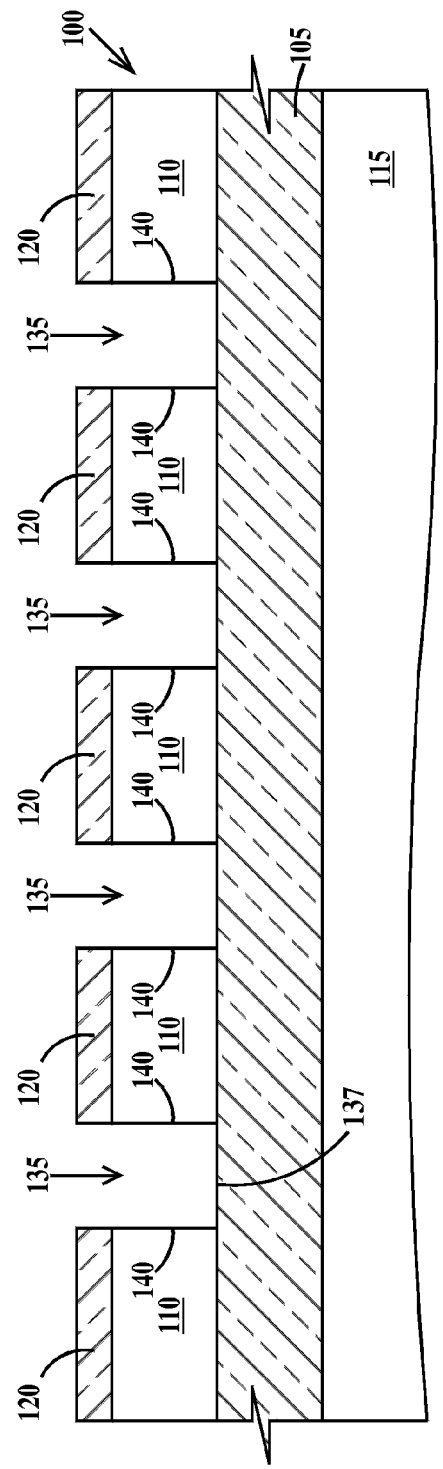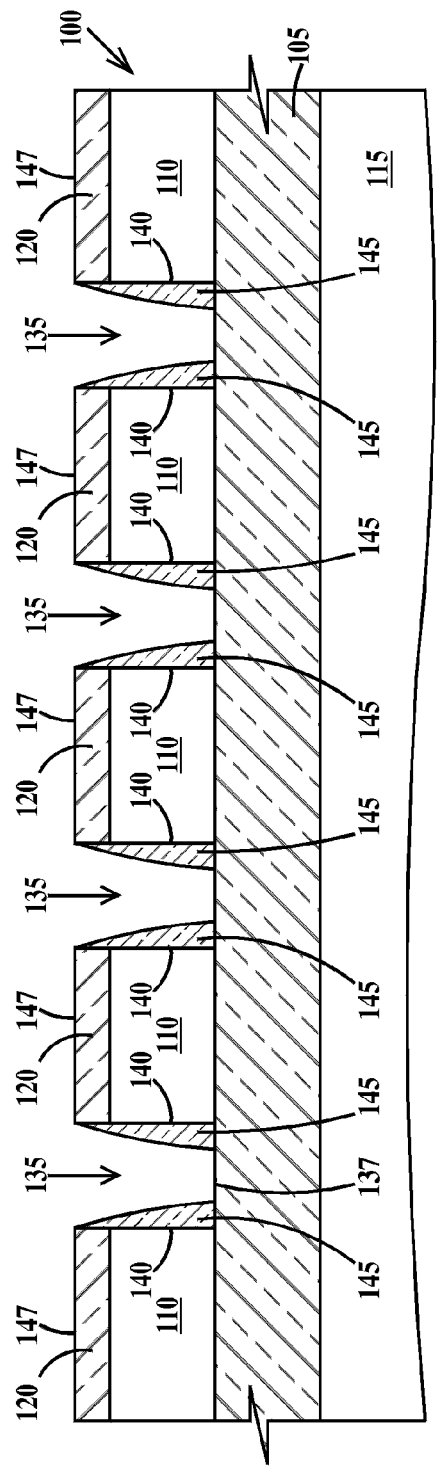

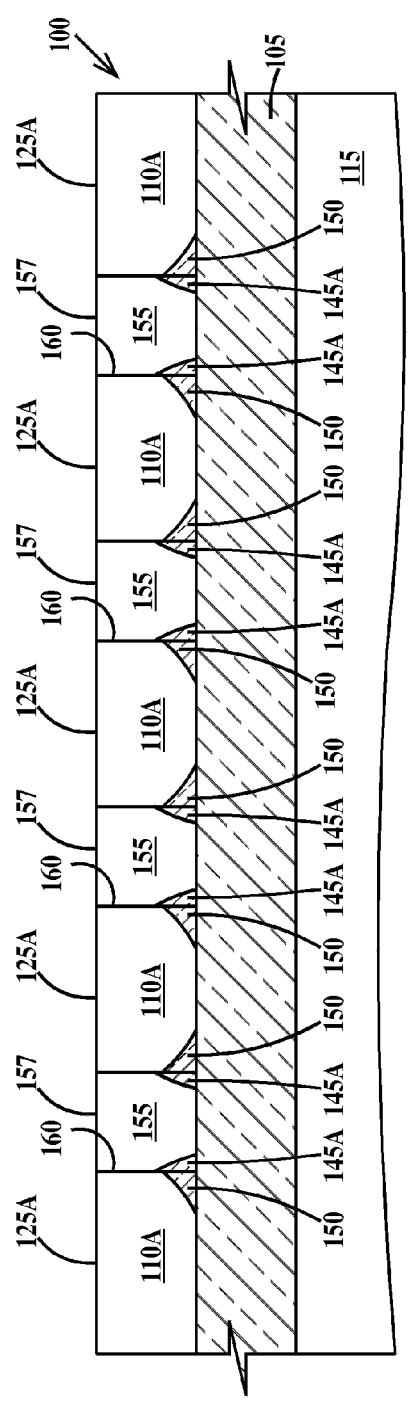
FIG. 6B
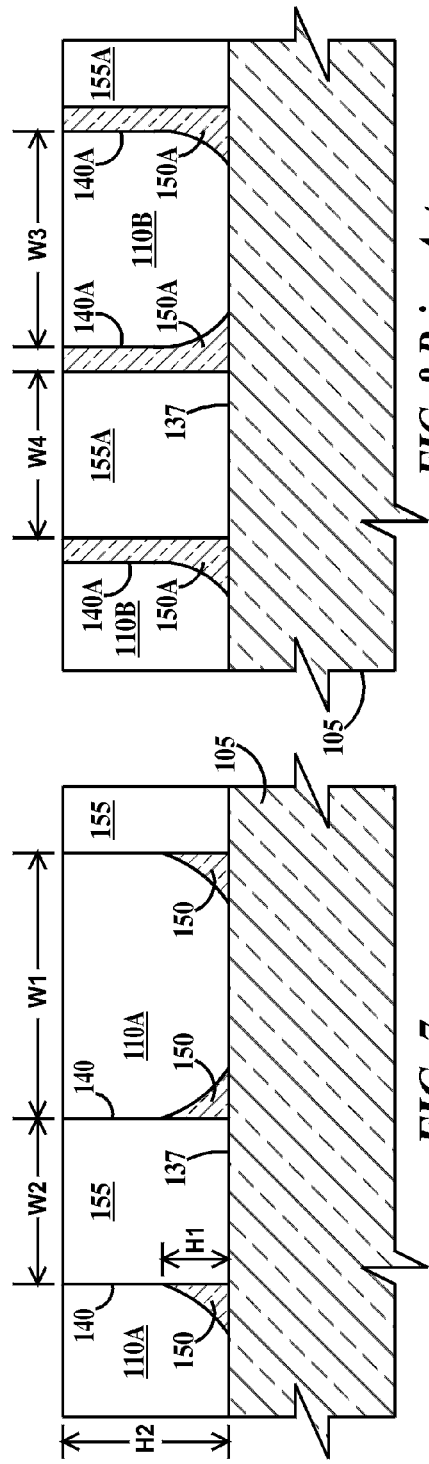
FIG. 7
FIG. 8 Prior Art

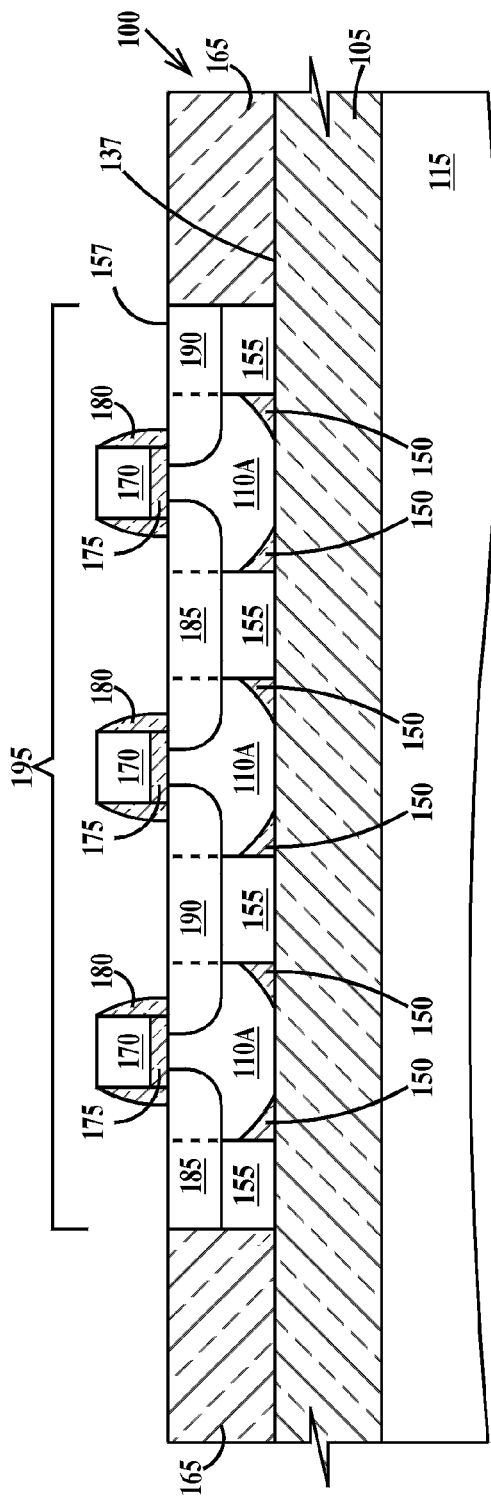
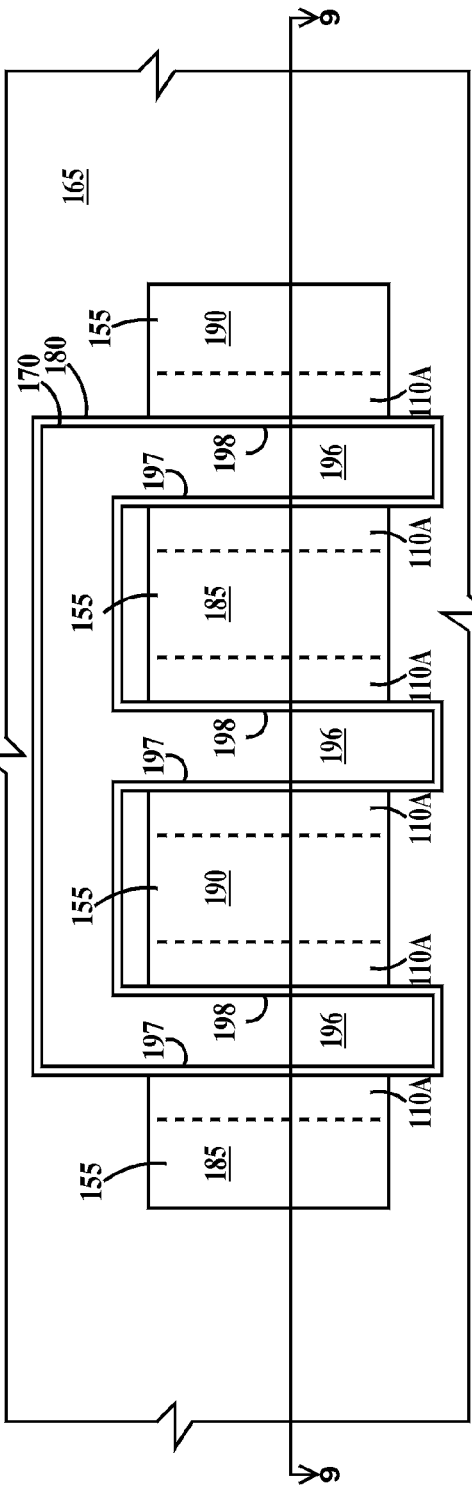

METHOD OF FABRICATING STRAINED SEMICONDUCTOR STRUCTURES FROM SILICON-ON-INSULATOR (SOI)

FIELD OF THE INVENTION

The present invention relates to the field of semiconductor manufacturing and; more specifically, it relates strained semiconductor structures and methods of fabricating strained semiconductor structures.

BACKGROUND

The push to ever increased performance (e.g. faster) devices such as CMOS field effect transistor (FETS) has driven the size of the devices ever smaller. However, as device size has decreased the performance increase has been found not to be as much as expected. Accordingly, there exists a need in the art to mitigate the deficiencies and limitations described hereinabove.

BRIEF SUMMARY

A first aspect of the present invention is a method, comprising: forming a pad layer on a top surface of a silicon layer of a substrate, the substrate comprising the silicon layer separated from a supporting substrate by a buried oxide layer; forming openings in the pad layer and etching trenches through the silicon layer to the buried oxide layer in the openings to form silicon regions from the silicon layer; forming spacers on the entirety of sidewalls of the silicon regions exposed in the trenches; forming oxide regions in corners of the silicon regions proximate to both the sidewalls and the buried oxide layer to form strained silicon regions, the oxide regions not extending to the pad layer; and removing at least a portion of the spacers and filling remaining spaces in the trenches with silicon to form filled regions abutting the strained silicon region.

A second aspect of the present invention is a structure, comprising: a semiconductor layer on a buried oxide layer on a supporting substrate, the semiconductor layer comprising first regions comprising strained silicon regions and oxide regions and second regions comprising silicon filled regions, the first regions between abutting the second regions, the first regions having respective top surfaces, bottom surfaces and sidewalls, the second regions having respective top surfaces, bottom surfaces and sidewalls, the bottom surfaces of the first and second regions abutting the buried oxide layer, the oxide regions in corners of the first regions proximate to both of the second regions and the buried oxide layer, the oxide regions extending along the sidewalls of the first regions from the bottom surfaces of the first regions toward the top surfaces of the first regions a distance less than a whole distance between the top and bottom surfaces of the first regions.

BRIEF DESCRIPTION OF THE SEVERAL VIEWS OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 1 through 6A are cross-sectional drawings illustrating initial fabrication steps for fabricating planar field effect transistors and finFETs according to embodiments of the present invention;

FIG. 6B is a cross-sectional drawing of an alternative structure to that illustrated in FIG. 6A;

FIGS. 7 and 8 are cross-sectional drawings illustrating critical differences between the embodiments of the present invention and the prior art;

FIG. 9 is a cross-sectional view through line 9-9 of FIG. 10, which is a top view of a first planar FET according to embodiments of the present invention;

DETAILED DESCRIPTION

Figure 5:
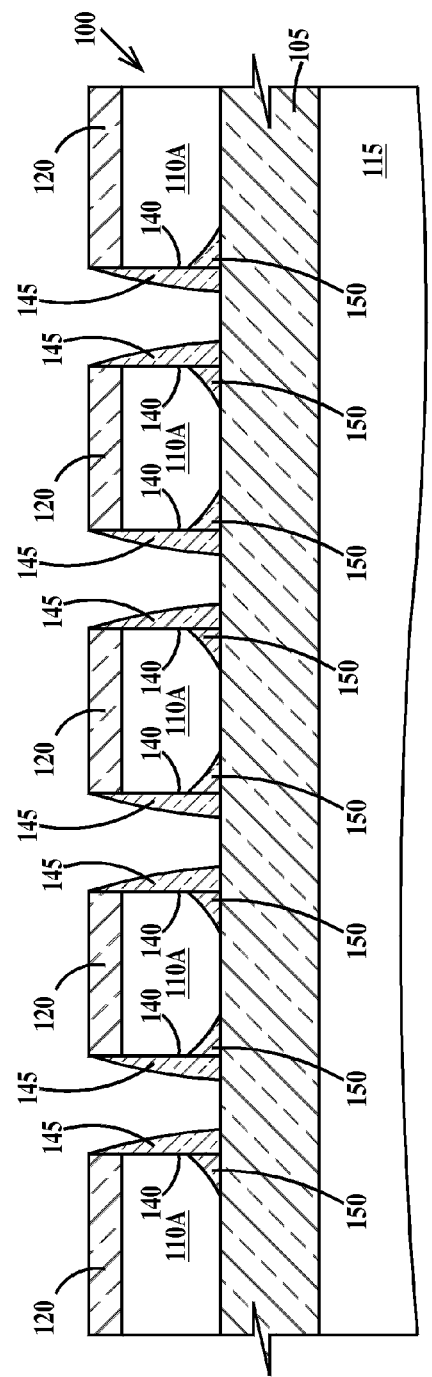

A planar FET is defined as an FET where the source/drains are formed on either side of and abutting a channel region in a semiconductor layer of a substrate. Top surfaces of the source/drains and channel region are in about the same plane and are parallel to a top surface of a the semiconductor layer. A gate dielectric is formed on the top surface of the channel region and a gate electrode is formed on the gate dielectric over the channel region. In planar FETs the gate dielectric and gate electrode are formed only on the top surface of the channel region.

A finFET is defined as an FET formed in a block (i.e., fin) of semiconductor material. The block is raised above a supporting layer and has exposed opposite ends, an exposed top surface and an exposed opposite first and second sidewalls. The source and drain of the finFET are formed in the ends of the block with the channel region between and abutting the source and drain. A gate dielectric is formed over the channel region. A gate electrode is formed on the gate dielectric. In a FinFET the gate dielectric and gate electrode are formed on at least two different surfaces of the block, at least one of the surfaces being a sidewall of the block.

In n-channel FETs and finFETs (NFETs and n-finFETs), the mobility of the majority carriers, electrons, is greater (hole mobility is less) when the channel is in tensile stress. The mobility of the majority carries of an NFET or a n-finFET are generally unaffected when the channel is in compressive stress. In p-channel FETs (PFETs and p-finFETs) the mobility of the majority carriers, holes, is greater than (electron mobility is less) when the channel region is in compressive stress. The embodiments of the present invention provide a method of inducing compressive stress in PFETs, p-finFETs, NFETs and n-finFETs that are formed in semiconductor material that is in compressive or tensile stress are called strained devices.

FIGS. 1 through 6A are cross-sectional drawings illustrating initial fabrication steps for fabricating planar field effect transistors and finFETs according to embodiments of the present invention. In FIG. 1, a substrate includes a buried oxide (BOX) layer 105 (e.g., silicon dioxide) between a single-crystal upper silicon layer 110 and a supporting substrate (e.g., single crystal silicon) 115. A pad layer 120 is formed on a top surface 125 of upper silicon layer 110. Pad layer may comprise two or more layers. In one example, pad layer comprises a silicon oxide layer on top surface 125 and a silicon nitride layer on top of the silicon oxide layer. BOX layer 105 has a thickness T1 and upper silicon layer 110 has a thickness T2. In one example, T1 is between about 5 and about 500 nm. In one example T2 is between about 10 and about 200 nm thick. Pad layer 120 is a diffusion barrier to oxygen, water vapor or both oxygen and water vapor.

In FIG. 2, openings 130 are formed in pad layer 120. Top surface 125 of upper silicon layer 110 is exposed in the bottom of openings 130. Openings 130 may be defined using a photolithographic/etch process.

A photolithographic process is one in which a photoresist layer is applied to a surface, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After further processing (e.g., a wet etch, a reactive ion etch (RIE) or an ion implantation), the patterned photoresist is removed. The photoresist layer may optionally be baked at one or more of the following steps: prior to exposure to actinic radiation, between exposure to actinic radiation and development, after development.

In FIG. 3, a trench 135 is etched (e.g., using an RIE) in upper silicon layer 110 using layer 120 between openings 130 (see FIG. 2) as a hardmask. A top surface 137 of BOX layer 110 is exposed in the bottom of trenches 135.

In FIG. 4, formed on sidewalls 140 of trenches 135 are dielectric sidewall spacers 145. Formation of sidewall spacers is well known in the art. Sidewall spacers 145 may be formed by forming a conformal coating all exposed surfaces of pad layer 120, sidewalls 140 and all exposed surfaces of BOX layer 105. In one example, the conformal coating does not completely fill trenches 145. After formation of the conformal coating, a directional (perpendicular to a top surface 147 of pad layer 120) etch (e.g., RIE) is performed to remove the coating from horizontal surfaces (top surface 147 of pad layer 120 and bottom surface 137 of BOX layer 105, but leaving the coating on sidewalls 140. In one example sidewall spacers 145 comprise silicon nitride. In one example, sidewall spacers comprise a material that is a diffusion barrier to oxygen, water vapor or both oxygen and water vapor. Because, sidewall spacers 145 are intended to prevent oxidation of the entire surfaces of sidewalls 140, it is critical that sidewall spacers 145 cover the entire surfaces of sidewalls 140. Because sidewall spacers 145 cover the entire surfaces of sidewalls 140, only those regions of upper silicon layer 110 proximate to BOX layer 105 where sidewalls 140 meet the BOX layer will be oxidized as illustrated in FIG. 5 because oxygen or water vapor will diffuse through BOX layer 105 but not through spacers 140 or pad layer 120.

In FIG. 5, a thermal oxidation process (e.g., in an oxygen or water vapor containing atmosphere at a temperature of at least 500° C.) is performed to form oxide regions 150 proximate to sidewalls 140 and BOX layer 105. Because silicon expands when it is oxidized pressure is exerted on patterned layer 110 (see FIG. 4) to create strained regions 110A. Oxide regions 150 are formed in corner regions of upper silicon layer 110, the corner regions defined by the intersection of BOX layer 105 and sidewalls 140. Oxide regions 150 extend from BOX layer 105 toward pad layer 120 along sidewalls 140 a distance that is less than the entire length of the sidewalls measured between the BOX layer 105 and pad layer 120. In FIG. 5, oxide regions 150 extend under strained region along BOX layer 105 a distance less than the entire width of the strained regions measured between opposite sidewalls 140. Oxide regions 150 are thinner the further toward the center of strained region 110A they extend. Oxide regions 150 may extend under the entire length of strained regions, becoming progressively thinner as the center of the strained region is approached. Because silicon oxide occupies a larger volume than the silicon from which it was made, the corners of strained regions 110A are pushed away from BOX layer 105 while the middle region is not and remains in contact with BOX layer 105, thus putting compressive stress on stained regions 110A.

Figure 6A:
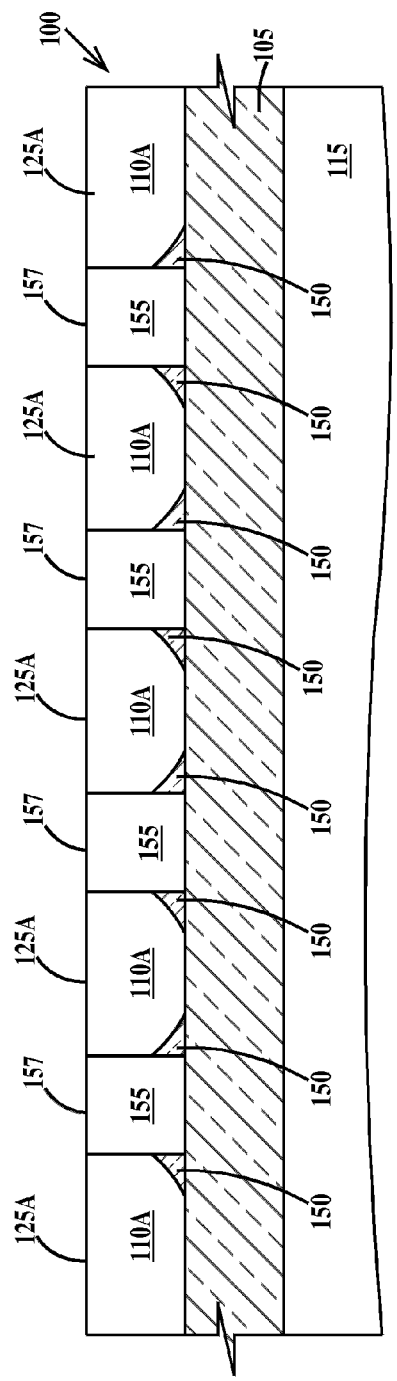

In FIG. 6A, sidewalls spacers 145 (see FIG. 5) are removed and the spaces between strained regions 110A are filled with silicon or polysilicon to form fill regions 155. An exemplary process sequence is: (1) completely remove sidewall spacers 145 (e.g., wet etch), (2) deposit polysilicon or grow epitaxial silicon to completely fill or overfill the space between stressed regions 110A with polysilicon or silicon fill 155 (epitaxial growth may result in either single-crystal silicon or polysilicon), (3) optionally perform a chemical mechanical polish to remove excess fill material from over pad layer 120, (4) recess etch fill regions 155 so top surfaces 157 of fill regions 155 are substantially coplanar with top surfaces 125A of strained regions 110A, and (5) remove remaining pad layer 120 (e.g., by wet etch). Adjacent strained regions 110A and fill regions 155 abut and electrically contact each other.

FIG. 6B is a cross-sectional drawing of an alternative structure to that illustrated in FIG. 6A. FIG. 6B is similar to FIG. 6A except spacers 145 (see FIG. 5) are not completely removed prior to forming filled regions 155, so small sidewall spacers 145A are left adjacent to oxide regions 150. It is important for minimizing resistance however, that spacers 145A not extend all the way to top surface 157 of fill regions 155 so there will be interfaces 160 between strained regions 110A and fill regions 155 to provide electrical contact between adjacent strained regions 110A and fill regions 155. In FIG. 6B the height of spacers 145A measured from BOX layer 105 is greater than the height of oxide regions 150 measured from BOX layer 105, the height of spacers 145A may be the same or less the heights of oxide regions 150. While either the structure of FIG. 6A or that of 6B may be used to form FETs and finFETs as described infra, the structure of FIG. 6A will be illustrated and it should be apparent that the FET and finFET embodiments that follow may use either structure.

FIGS. 7 and 8 are cross-sectional drawings illustrating critical differences between the embodiments of the present invention and the prior art. In FIG. 7, oxide regions 150 have a height H1 measured from top surface 137 of BOX layer 105 and strained regions 110A have a height (more correctly thickness) H2 measured from top surface 137 of BOX layer 105. H2 is greater than H1. Oxide regions 150 do not extend along the entire surface of sidewalls 140. In one example H2 is at least twice H1. The width of strained regions 110A is W1. The width of fill region 155 is W2. In FIG. 8, oxide regions 150A are formed on the entire surface of sidewalls 140A. The width of strained region 110B is W3 and the width of fill region 155A is W4. If openings 135 (see FIG. 3) were originally the same width prior to forming oxide regions 150 and 150A then W1 is greater than W3 and W2 is greater than W4. At minimum groundrules this results in the width of strained region 110B being so small as to adversely effect the expected performance of the devices. If the groundrules are relaxed, then device density is adverse impacted. Additionally, because silicon oxide has a lower Young's modulus (is less stiff) than silicon, the oxide region 105A of FIG. 8 itself acts to reduce the strain in strained region 150A of FIG. 8 to less than that of strained region 110A of FIG. 7, everything else being equal.

FIG. 9 is a cross-sectional view through line 9-9 of FIG. 10, which is a top view of a first planar FET according to embodiments of the present invention. In FIGS. 9 and 10 a shallow trench isolation (STI) has been formed. STI 165 extends from top surface 157 of fill regions 155 to top surface 137 of BOX layer 137. In FIGS. 9 and 10 a gate electrode 170, a gate dielectric layer 175, optional sidewall spacers 180 and sources 185 and drains 190 have been formed to fabricate a planar FET 195. STI 165 completely surrounds the perimeter of FET 195 formed from fill regions 155 and strained regions 110A. Gate electrode 170 is formed over strained regions 110 and can be seen (FIG. 10) to comprise three co-joined fingers 196. Gate dielectric layer 175 intervenes between gate electrode 170 and strained regions 110A. Sources 185 are formed in fill regions 155 and portions of strained regions 110A on first sides 197 of the fingers 196 of gate electrode 170 not covered by gate electrode 170 by ion implantation, though there may be some source out-diffusion or an angled ion implant to extend sources 186 under gate electrode 170. Drains 190 are formed in fill regions 155 and portion of strained regions 110A on opposite second sides 198 of fingers 196 not covered by gate electrode 170 by the same ion implantation. Again, though there may be some drain out-diffusion or the same angled ion implant to extend drains 190 under gate electrode 170. Regions of strained regions 110A intervene between sources 185 and drains 190. In FIGS. 9 and 10, the dashed lines indicate the interface between fill regions 155 and strained regions 110A. An exemplary process flow starting from the structure of FIG. 6A (or 6B) is: (1) form gate dielectric layer 175, (2) form a conductive layer (e.g., polysilicon) on gate dielectric layer 175 and pattern the conductive layer to form gate electrode 170, (3) optionally form spacers 175, and (4) form sources 185 and drains 190 (e.g., by one or more ion implantations. Note STI 165 may be formed (i) immediately before processes illustrated in FIG. 2 and described supra, or (ii) after the process illustrated in FIGS. 6A and 6B and described supra but before forming the gate dielectric layer. In one example, FET 195 is a PFET. In one example FET 195 is an NFET. While FET 195 is illustrated as having three fingers 196, there many be a few as one finger or more than three fingers.

Figure 11:
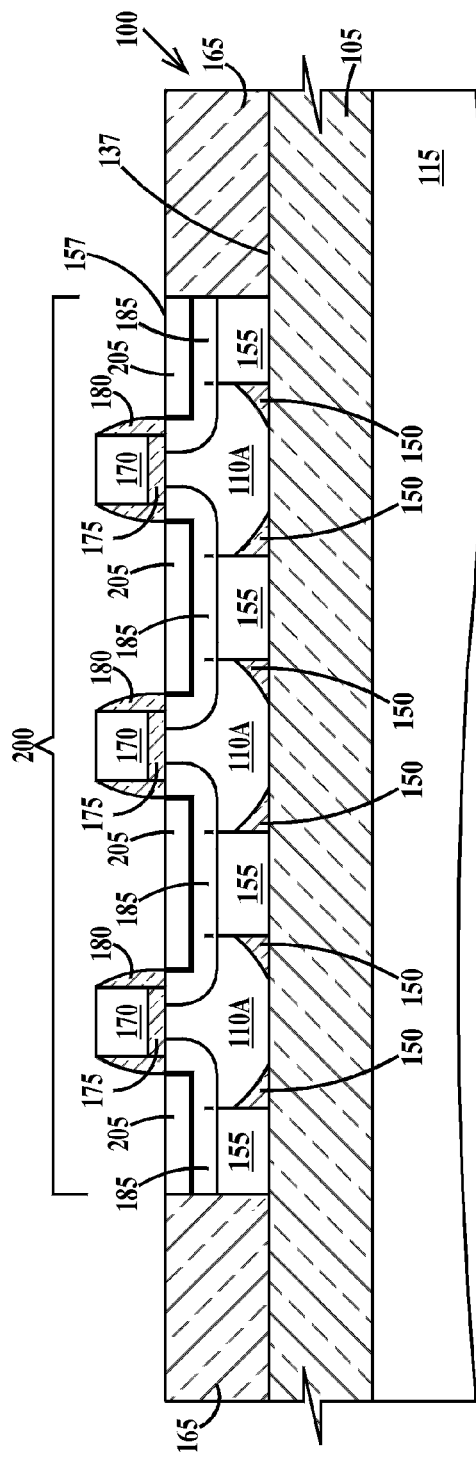
FIG. 11 is a cross-sectional view through line 11-11 of FIG. 12, which is a top view of a second planar FET according to embodiments of the present invention.
Figure 12:
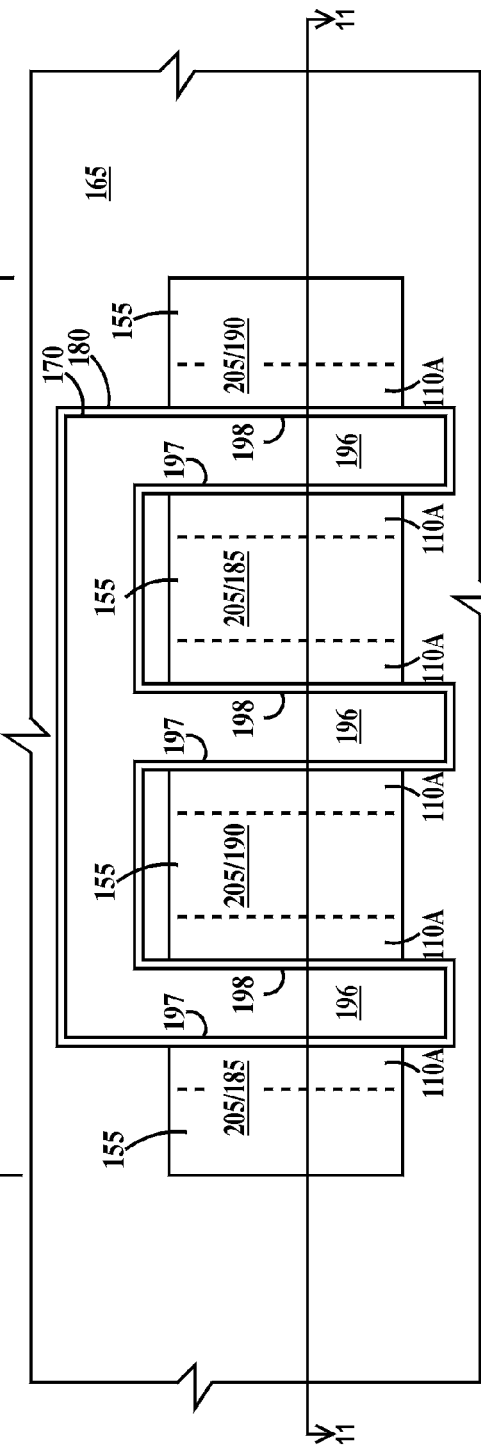

FIG. 11 is a cross-sectional view through line 11-11 of FIG. 12, which is a top view of a second planar FET according to embodiments of the present invention. FIGS. 11 and 12 are similar to FIGS. 9 and 10 except an FET 200 includes region of SiGe 205 is sources 185 and drains 190. A exemplary process flow starting from the structure of FIG. 6A (or 6B) is: (1) form gate dielectric layer 175 on top surfaces 125A and 157 (see FIGS. 6A and 6B), (2) form a conductive layer (e.g., polysilicon) on gate dielectric layer 175 and pattern the conductive layer to form gate electrode 170, (3) optionally form spacers 175 (as illustrated), (4) photolithographically etch trenches into fill regions 155 and strained regions 110A and fill with SiGe, and (5) form sources 185 and drains 190 (e.g., by one or more ion implantations). Note STI 165 may be formed (i) immediately before processes illustrated in FIG. 2 and described supra, or (ii) after the process illustrated in FIGS. 6A and 6B and described supra but before forming the gate dielectric layer. In one example, FET 200 is a PFET. In one example FET 200 is an NFET. While FET 200 is illustrated as having three fingers 196, there many be a few as one finger or more than three fingers.

Figure 13:
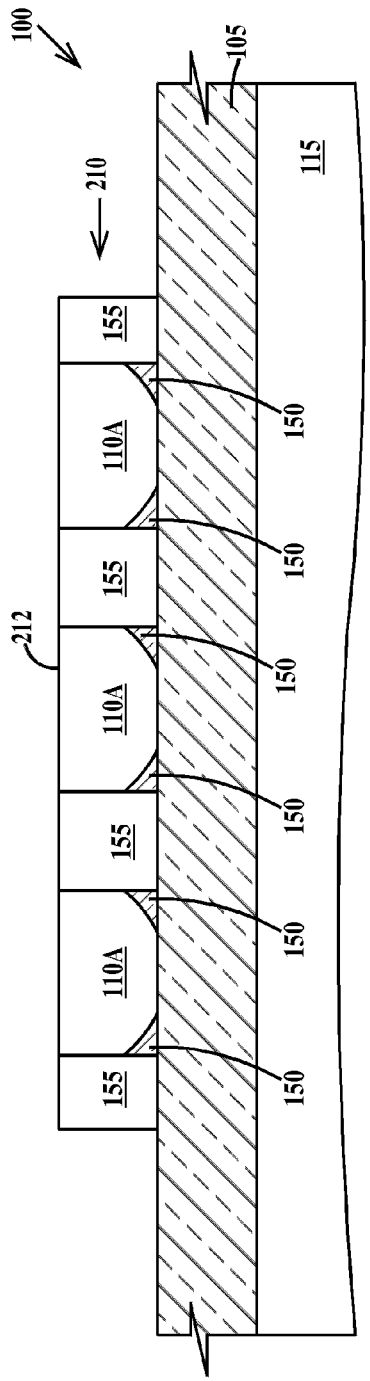
FIG. 13 is a cross-sectional view through line 13-13 of FIG. 14, which is a top view of additional steps performed after the steps illustrated in FIGS. 6A and 6B for fabricating a finFET according to embodiments of the present invention.
Figure 14:
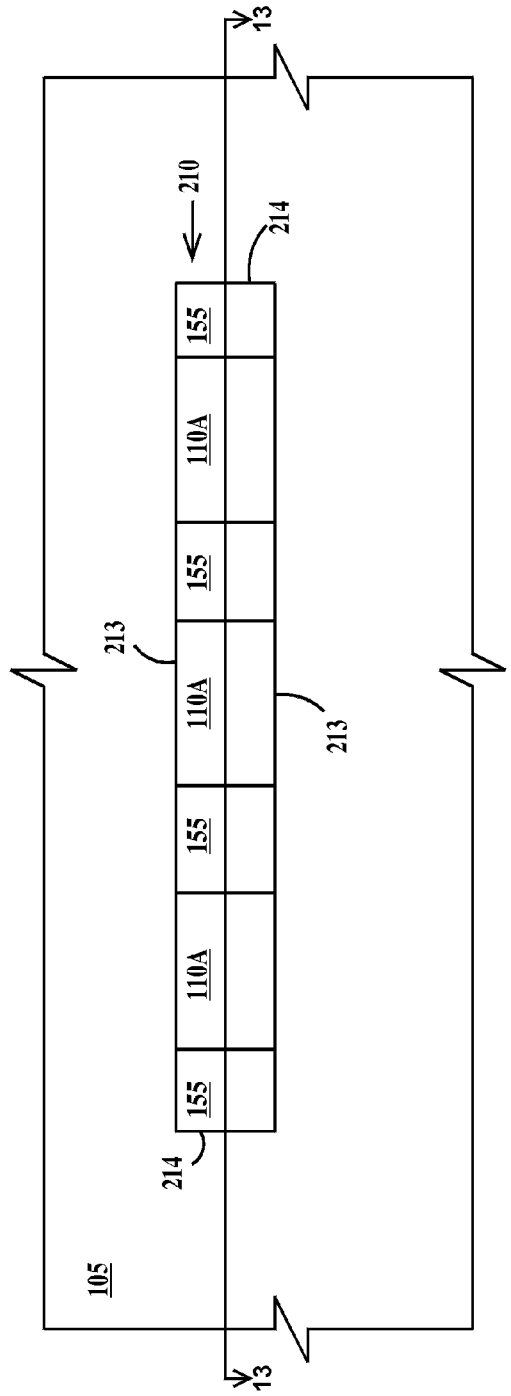

FIG. 13 is a cross-sectional view through line 13-13 of FIG. 14, which is a top view of additional steps performed after the steps illustrated in FIGS. 6A and 6B for fabricating a finFET according to embodiments of the present invention. FIGS. 13 and 14 follow from FIG. 6A (or 6B, though the structure of FIG. 6A is illustrated). In FIGS. 13 and 14, a fin 210 of semiconductor material comprising a set of alternating fill regions 155 and strained regions 110A. Fin 210 may be formed using a photolithographic process/etch process. Fin 210 has a top surface 212, opposite sidewalls 213 and opposite ends 214. The entirety of the surfaces of sidewalls 213 and ends 214 are exposed.

Figure 15:
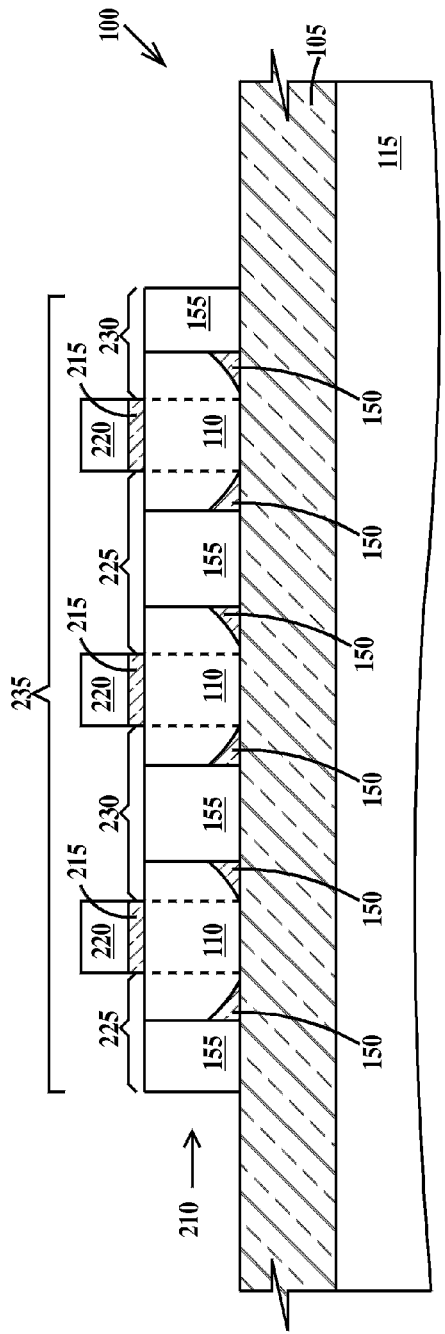
FIG. 15 is a cross-sectional view through line 15-15 of FIG. 16, which is a top view of a finFET according to embodiments of the present invention.
Figure 16:
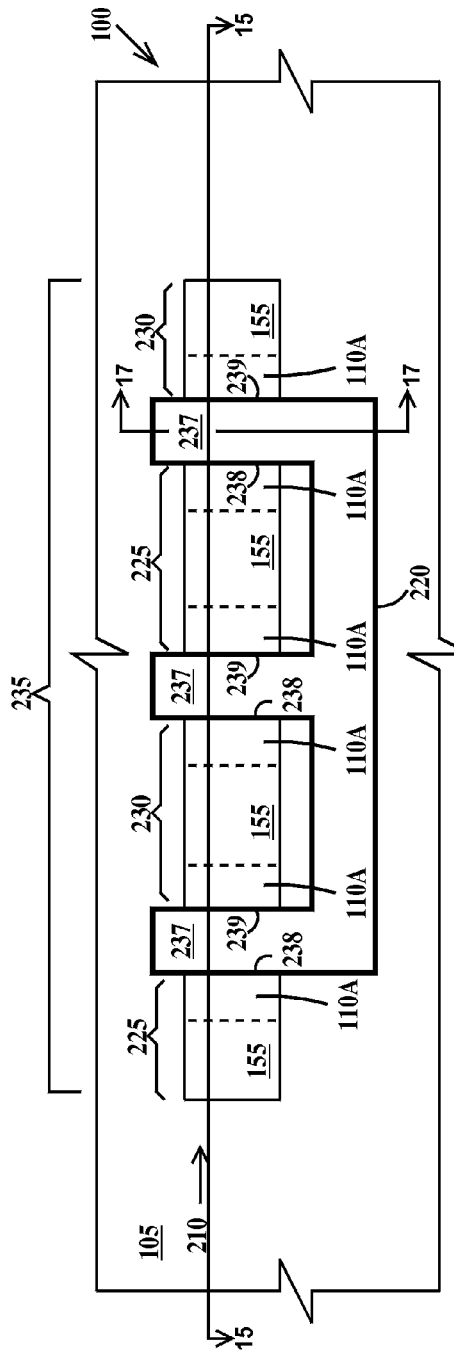

FIG. 15 is a cross-sectional view through line 15-15 of FIG. 16, which is a top view of a finFET according to embodiments of the present invention. In FIGS. 15 and 16 a gate dielectric layer 215, a gate electrode 220, and sources 225 and drains 230 have been formed to fabricate a finFET 235. Gate electrode 235 is formed over strained regions 110A and can be seen (FIG. 16) to comprise three co joined fingers 237. Gate dielectric layer 215 intervenes between gate electrode 220 and strained regions 110A. Sources 225 are formed in fill regions 155 and portions of strained regions 110A not covered by gate electrode 220 by ion implantation on first sides 238 of fingers 237 of gate electrode 220. Drains 230 are formed in fill regions 155 and portions of strained region 110A not covered by gate electrode 220 by the same ion implantation on second sides 239 of fingers 237. Portions of strained regions 110A intervene between sources 225 and drains 230. In FIGS. 15 and 16, the dashed lines indicate the interface between fill regions 155 and strained regions 110A. An exemplary process flow starting from the structure of FIG. 6A (or 6B) is: (1) form gate dielectric layer 215 on the top surface, sidewalls and ends of fin 210, (2) form a conductive layer (e.g., polysilicon) on gate dielectric layer 215 and pattern the conductive layer to form gate electrode 220 on those regions of gate dielectric layer 215 that are over the top surface and sidewalls fin 210 in strained regions 110A (see FIG. 17), and (3) form sources 225 and drains 230 (e.g., by one or more ion implantations). In one example, finFET 235 is a p-finFET. In one example finFET 235 is an n-finFET. While finFET 235 is illustrated as having three fingers 237, there many be a few as one finger or more than three fingers.

Figure 17:
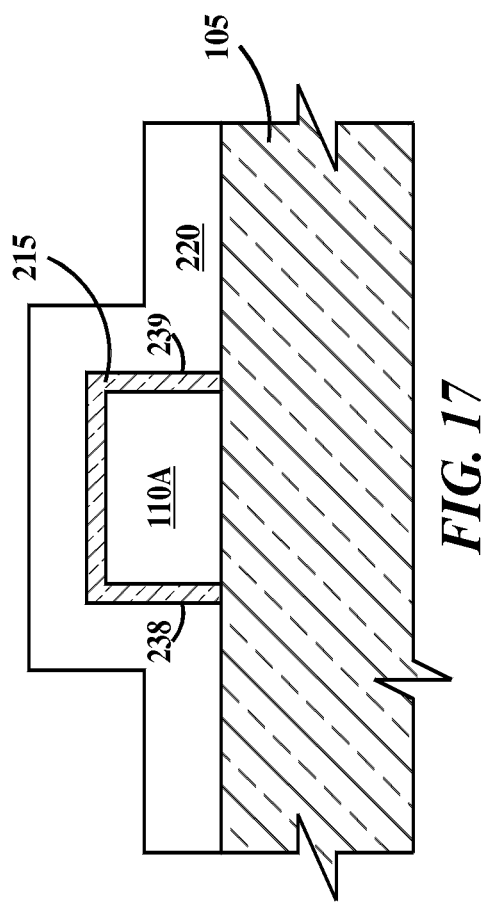
FIG. 17 is a cross-sectional view through line 17-17 of FIG. 16, of the finFET.

FIG. 17 is a cross-sectional view through line 17-17 of FIG. 16. FIG. 17 clearly illustrates that gate electrode 220 is formed on three surfaces of strained regions 110A.

For NFETs, PFETs, N-finFETs and P-finFETs the embodiments of the present provide improved device density over the prior art. Additionally, for PFETs and P-finFETs stressed silicon regions 110A (see FIGS. 9-12, 15 and 16) increase the mobility of the majority carriers and thus the performance of the PFET over the prior art.

The finFET structure thus fabricated includes a fin of alternating first and second regions, on a buried oxide layer on a supporting substrate, the semiconductor layer comprising first regions comprising strained silicon regions and oxide regions and second regions comprising silicon filled regions, the first regions between abutting second regions, the first regions having respective top surfaces, bottom surfaces and sidewalls, the second regions having respective top surfaces, bottom surfaces and sidewalls, the bottom surfaces of the first and second regions abutting the buried oxide layer, the oxide regions in corners of the first regions proximate to both of the second regions and the buried oxide layer, the oxide regions extending along the sidewalls of the first regions from the bottoms of the first regions toward the top surfaces of the first regions a distance less than a whole distance between the top and bottom surfaces of the first regions, a gate dielectric layer over the top surface and sidewalls of regions of the first regions; a gate electrode on the gate dielectric layer over the top surface and sidewalls of regions of the strained silicon regions; and source/drains in the strained regions on opposite sides of the gate electrode and in the filled regions.

The finFET structure is fabricated by forming a pad layer on a top surface of a silicon layer of a substrate, the substrate comprising the silicon layer separated from a supporting substrate by a buried oxide layer; forming openings in the pad layer and etching trenches through the silicon layer to the buried oxide layer in the openings to form silicon regions from the silicon layer; forming spacers on the entirety of sidewalls of the silicon regions exposed in the trenches; forming oxide regions in corners of the silicon regions proximate to both the sidewalls and the buried oxide layer to form strained silicon regions, the oxide regions not extending to the pad layer; removing at least a portion of the spacers and filling remaining spaces in the trenches with silicon to form filled regions between the silicon regions; forming a fin containing alternating strained and filled regions; forming a gate dielectric layer over the top surface and sidewalls of regions of the strained silicon regions; forming a gate electrode on the gate dielectric layer over the top surface and sidewalls of regions of the strained silicon regions; and forming source/drains filled regions and in the strained regions not covered by the gate electrode on opposite sides of the gate electrode.

Thus, the embodiments of the present invention provide an enhanced strained semiconductor structure and method of fabricating an enhanced strained semiconductor structure, as well as planar FETs and finFETs having enhanced strain and method of fabricating planar FETs and finFETs having enhanced strain and thus increased performance overcoming the limitations and deficiencies described supra.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   forming a pad layer on a top surface of a single-crystal silicon layer of a substrate, said substrate comprising said single-crystal silicon layer on a top surface of a buried silicon oxide layer and said buried silicon oxide layer on a top surface of a supporting silicon substrate;
   forming openings in said pad layer and etching trenches through said single-crystal silicon layer to said buried silicon oxide layer in said openings to form silicon regions from said single-crystal silicon layer;
   forming spacers on the entirety of sidewalls of said silicon regions exposed in said trenches;
   forming oxide regions in said silicon regions, said oxide regions in corners of said silicon regions proximate to both said sidewalls and said buried silicon oxide layer to convert said silicon regions to strained silicon regions, said oxide regions not extending to said pad layer; and
   after forming said oxide regions, removing at least a portion of said spacers and filling remaining spaces in said trenches with silicon to form filled regions abutting said strained silicon regions.

2. The method of claim 1, wherein said oxide regions are formed by thermal oxidation of corner regions of said silicon regions.

3. The method of claim 1, wherein after said removing said at least said portion of said spacers, sidewall regions of said strained silicon regions proximate to said pad layer are exposed in said trenches.

4. The method of claim 1, wherein said oxide regions extend from said buried silicon oxide layer toward said pad layer in said strained silicon regions a distance that is no greater than about 50% of the total distance between said buried oxide layer and said pad layer measured along said sidewalls.

5. The method of claim 1, wherein said pad layer and said spacers are diffusion barriers to oxygen, water vapor or both oxygen and water vapor.

6. The method of claim 1, wherein said strained silicon regions are in compressive stress.

7. The method of claim 1, further including:
   after said filling remaining spaces in said trenches with silicon:
      removing said pad layer;
      forming a gate dielectric layer over said strained silicon regions;
      forming a gate electrode on said gate dielectric layer over regions of said strained silicon regions; and
      forming source/drains in portions of said strained regions not covered by said gate electrode on opposite sides of said gate electrode and in said filled regions.

8. The method of claim 7, further including:
   forming shallow trench isolation abutting said strained regions and said filled regions, said shallow trench isolation extending to said buried silicon oxide layer.

9. The method of claim 1, further including:
   after said filling remaining spaces in said trenches with silicon:
      removing said pad layer;
      forming a gate dielectric layer over said strained silicon regions;
      forming a gate electrode on said gate dielectric layer over said regions of said strained silicon regions;
      forming shallow trenches in portions of said strained regions not covered by said gate electrode on opposite sides of said gate electrode and in said filled regions, said shallow trenches not extending to said buried silicon oxide layer;
      filling said shallow trenches with SiGe to form SiGe regions; and
      forming source/drains in said SiGe regions on opposite sides of said gate electrode.

10. The method of claim 9, further including:
    forming shallow trench isolation abutting said strained regions and said filled regions, said shallow trench isolation extending to said buried silicon oxide layer.

* * * * *